United States Patent
Cherniski et al.

[11] Patent Number: 6,125,044
[45] Date of Patent: Sep. 26, 2000

[54] SUPPRESSING EMI WITH PCB MOUNTED FERRITE ATTENUATOR

[75] Inventors: Andrew M. Cherniski, Rescue; Alisa C. Sandoval, Grass Valley, both of Calif.

[73] Assignee: Hewlett-Packard Company, Palo Alto, Calif.

[21] Appl. No.: 09/274,722

[22] Filed: Mar. 23, 1999

[51] Int. Cl.[7] ..................................................... H05K 7/14
[52] U.S. Cl. .......................... 361/799; 361/752; 361/753; 361/788; 361/794; 361/799; 361/800; 361/816; 361/818; 174/35 R; 174/35 BC; 174/250; 174/253; 174/260; 333/12; 333/181
[58] Field of Search ..................................... 361/754, 756, 361/759, 794, 798, 799, 80 D, 816, 818; 333/181, 12, 201; 174/250, 253, 260, 35 R, 35 GC

[56] References Cited

U.S. PATENT DOCUMENTS

| | | | |
|---|---|---|---|
| 5,416,427 | 5/1995 | Tracewell | 324/754 |
| 5,570,270 | 10/1996 | Naedel et al. | 361/687 |
| 5,604,352 | 2/1997 | Schuetz | 250/492.3 |
| 5,652,553 | 7/1997 | Pollmeier | 333/1 |
| 5,748,464 | 5/1998 | Schuetz | 363/131 |

OTHER PUBLICATIONS

"Ferrite RFI Suppressors", FerriShield, Inc., Interference Control Components Catalog (1997).

*Primary Examiner*—Jeffrey Gaffin
*Assistant Examiner*—Tuan Dinh

[57] ABSTRACT

A printed circuit board (PCB) assembly includes a PCB having and a ferrite attenuator. The PCB includes input/output signal paths for carrying signals to and from the PCB, power paths for conducting power to the PCB, and ground paths for connecting the PCB to a ground level. The ferrite attenuator surrounds the input/output signal paths, the power paths, and the ground paths. The PCB assembly is preferably used in a system, such as a computer system, where the ferrite attenuator suppresses electromagnetic interference (EMI) generated in the system.

20 Claims, 4 Drawing Sheets

SUPPRESSING EMI WITH PCB MOUNTED FERRITE ATTENUATOR

THE FIELD OF THE INVENTION

The present invention generally relates to suppressing electro-magnetic interference (EMI) from a system, and more particularly to suppressing common mode energy EMI conducted through a printed circuit board (PCB) in a system, such as a computer system.

BACKGROUND OF THE INVENTION

There are many known techniques for suppressing electromagnetic interference (EMI) from a system, such as computer system to contain or diminish stray noise signals. Systems such as computer systems typically need to comply to an electromagnetic compliance (EMC) standard which defines limits to levels of stray EMI noise signals. Thus, the design goal of an EMC solution is to design a system with stray EMI noise signal levels below the EMC standard limit while minimizing the cost of compliance.

A system, such as a computer system, is typically designed with distinct domains to separate domains having energetic EMI noise sources from more sensitive domains having regions with less robust EMI shielding to an outside environment. Example more sensitive domains of a computer system include regions containing input/output (I/O) card cages, system I/O, and peripheral devices because it is particularly difficult to suppress EMI conducted from these regions. In high-performance computer systems, the most energetic EMI noise sources typically include processors, memory, and coupling circuitry which couples processors to other processors, memory, or I/O devices. The stray EMI noise signals produced by the processors, memory, and coupling circuitry conducts to I/O or peripheral domains from which the stray EMI noise radiates from cables or directly from user accessible devices. I/O boards, disk drives, or core I/O devices are typically not significant contributors to the total direct radiated EMI noise produced by the computer system.

A robust EMC computer system design which partitions the energetic processor domain from the I/O and peripheral domains typically blocks most of the direct radiated EMI noise signals from entering the susceptible I/O and peripheral domains. Unfortunately, DMI noise signals also conduct through interconnecting electrical paths between the partitioned domains as common mode energy EMI. EMI noise is also typically conducted through power paths and ground paths. Any conducted EMI noise contaminates an otherwise quiet I/O or peripheral domain leading to leakage to an outside environment.

One conventional EMC system design disposes ferrite slabs over semiconductor integrated circuit (IC) chips to suppress direct radiated EMI signals from entering susceptible domains. This solution, however, does not prevent the conduction of common mode energy EMI through interconnecting electrical paths between domains.

One conventional EMC system design to limit excessive cable radiated common mode energy EMI resulting from cross domain EMI noise contamination includes ferrite attenuators or suppressors mounted around cables approximate to where the cables exit the system. The ferrite attenuators surrounding the cables elevate EMI noise source impedance via electrical losses occurring in the ferrite. As a result, the efficiency of the propagation of common mode energy EMI noise signals to free space is reduced. Since this design technique does not prevent EMI noise contamination of an I/O card cage, each cable exiting the system is required to have a ferrite attenuator mounted on the cable approximate the exit point from the system. In systems, such as computer systems, where many cables exit the system, the cost of this solution is excessive. In addition, the effectiveness of this technique is reduced if cable placement is changed or if the ferrite attenuator is improperly located on the cable.

For reasons stated above and for other reason presented in greater detail in the Description of the Preferred Embodiments section of the present specification, a system, such as a computer system, is desired which better suppresses common mode energy EMI noise which propagates through interconnecting electrical paths, power paths, and ground paths between domains and eventually radiates to free space. In addition, a system, such as a computer system, is desired which effectively suppresses common mode energy EMI at a low cost.

SUMMARY OF THE INVENTION

The present invention provides a printed circuit board (PCB) assembly including a PCB and a ferrite attenuator. The PCB includes input/output signal paths for carrying signals to and from the PCB, power paths for conducting power to the PCB, and ground paths for connecting the PCB to a ground level. The ferrite attenuator surrounds the input/output signal paths, the power paths, and the ground paths.

In one form of the present invention a computer system includes a PCB assembly according to the present invention. The computer system also includes a system core PCB having a microprocessor. The PCB assembly includes a second PCB electrically coupled to the system core PCB. The second PCB includes input/output signal paths for carrying signals between the second PCB and the system core PCB board, power paths for conducting power to the second PCB, and ground paths for connecting the second PCB to a ground level. A ferrite attenuator is installed on the second PCB and surrounds the input/output signal paths, the power paths, and the ground paths. In one embodiment of the computer system, the computer system includes a third PCB electrically coupled to the second PCB. The third PCB includes cable connectors for coupling cables to the third PCB for carrying external signals to and from the third PCB. In another embodiment of the computer system, the second PCB further includes cable connectors for coupling cables to the second PCB for carrying external signals to and from the second PCB.

In one embodiment of the PCB assembly according to the present invention, the ferrite attenuator has two ferrite attenuator portions. In this embodiment, the PCB assembly includes clips, such as metal clips, for clamping the two ferrite attenuator portions together. In this embodiment, the PCB assembly further includes a first foam pad disposed between a first one of the ferrite attenuator portions and the PCB, and a second foam pad disposed between a second one of the ferrite attenuator portions and the PCB. The foam pads dampen shock exerted on the ferrite attenuator occurring during system handling and system use.

In one embodiment, the two ferrite attenuator portions are each "C" shaped and fit together around a portion of the PCB having the input/output signal paths, the power paths, and the ground paths. In one embodiment, the PCB includes two cut out portions defined therein and the ferrite attenuator portions each include ends which mate together in the PCB cut out portions. In this embodiment, the PCB assembly further includes two clips for clamping the ends of the two ferrite attenuator portions together in the PCB cut out portions.

In one embodiment of the PCB assembly, at least one of the ferrite attenuator portions includes a ramp located at each end of the at least one ferrite attenuator portion, and a groove located inwardly from the ramp. In this embodiment, each clip includes at least one lead-in portion for permitting each clip to more easily slide over the ramp of the at least one ferrite attenuator portion. In this embodiment, each clip includes an elbow portion which matches the groove of the at least one ferrite attenuator portion. Each ferrite attenuator portion preferably includes a ramp located at each end of the ferrite attenuator portion and each clip preferably includes an upper jaw having a lead-in portion and a lower jaw having a lead-in portion to permit each chip to slide easily over the ramps of the ferrite attenuator portions.

In one embodiment, the at least one ferrite attenuator portion includes a flat portion located between the ramp and the groove, and each clip includes a flat portion which matches the flat portion of the at least one ferrite attenuator portion.

A system, such as a computer system, having a PCB assembly according to the present invention suppresses common mode energy EMI noise which propagates through interconnecting electrical paths, power paths, and ground paths between domains as close as possible to the source of the EMI noise by surrounding the input/output signal paths, the power paths, and the ground paths with a ferrite attenuator. A larger percentage of common mode energy EMI noise is suppressed with the ferrite attenuator being as close as possible to the source of the EMI noise, because the effective increase in EMI noise source impedance becomes greater as the ferrite attenuator is disposed closer to the EMI source. The cost of such a system according to the present invention is low, because one ferrite attenuator surrounds all of the signal paths between an EMI generating domain and an adjacent EMI conducting domain. Other potential downstream EMI conducting domains do not require separate ferrite attenuators, because the EMI noise is suppressed at the domain adjacent the EMI generating domain.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
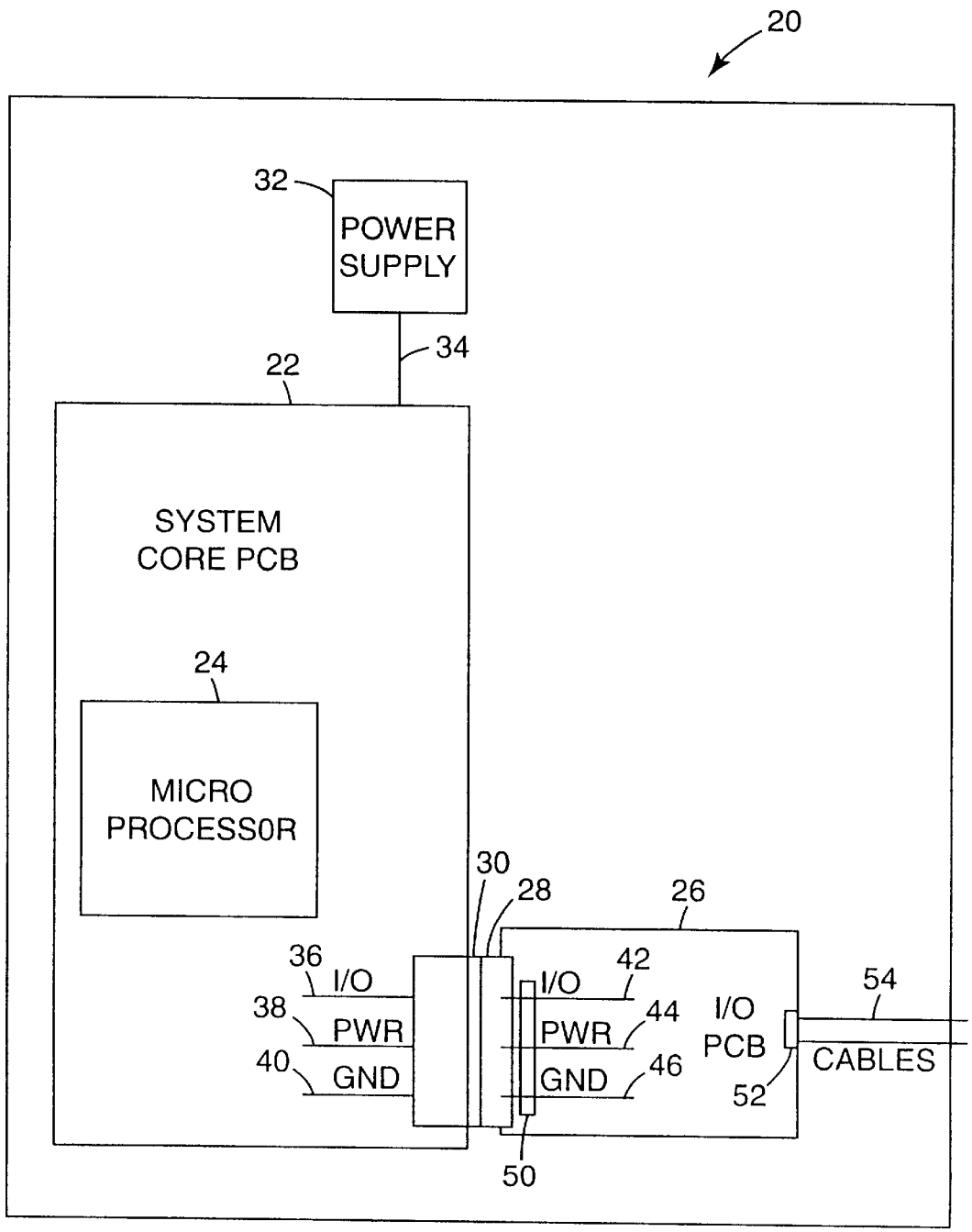
FIG. 1 is a block diagram of a computer system including an I/O printed circuit board (PCB) having a ferrite attenuator according to the present invention.

One embodiment of a computer system according to the present invention is illustrated generally at 20 in FIG. 1 in block diagram form. The present invention is described in detail herein with reference to computer systems, but can apply equally to other electrical systems which generate electromagnetic interference (EMI). Computer system 20 includes a system core printed circuit board (PCB) 22 having a microprocessor 24 for performing sequences of logical operations. An input/output (I/O) PCB 26 is coupled to system core PCB 22 via a connector 28 on I/O PCB 26 and a corresponding connector 30 on system core PCB 22. A power supply 32 supplies power to system core PCB 22 via power rails 34.

System core PCB 22 which includes microprocessor 24 constitutes a distinct domain which includes energetic EMI noise sources. Therefore, the system core PCB 22 domain is partitioned from the rest of computer system 20 to block and isolate most of the direct radiated EMI noise signals from entering other susceptible domains. I/O PCB 26 constitutes one such susceptible domain, which itself is not a significant contributor to the total direct radiated EMI noise produced by computer system 20. I/O PCB 26 is, however, susceptible to conducting common mode energy EMI noise signals if these EMI noise signals are not properly contained.

System core PCB 22 provides I/O signals to connector 30 on I/O signal paths 36. System core PCB 22 provides power to connector 30 through power paths 38. System core PCB provides a ground level to connector 30 through ground paths 40. The I/O signals conducted on I/O signal paths 36, the power conducted on power paths 38, and the ground level coupled on ground paths 40 are all conducted through connector 30 to connector 28 of I/O PCB 26.

I/O PCB 26 includes I/O signal paths 42 for carrying I/O signals between connector 28 and I/O PCB 26. /O PCB 26 includes power paths 44 for conducting power to I/O PCB 26 from connector 28. I/O PCB 26 includes ground paths 46 for connecting I/O PCB 26 to a ground level.

A ferrite attenuator or suppressor 50 is installed around I/O PCB 26 at a location as close as possible to connector 28. Ferrite attenuator 50 surrounds I/O signal paths 42, power paths 44, and ground paths 46 so that all signals including power and ground are surrounded by the ferrite material of ferrite attenuator 50 to suppress common mode energy EMI noise signals. Ferrite attenuator 50 is positioned and locked in place relative to I/O PCB 26. No signal, power, or ground paths are permitted through chassis or other electrical interconnections, because alternative signal paths would corrupt the EMI isolation provided by ferrite attenuator 50 by providing a path to conduct common mode energy EMI from system core PCB 22 to I/O PCB 26, from which the EMI noise would be radiated to an outside environment.

I/O PCB includes cable connectors 52 for coupling cables 54 to I/O PCB 26. Cables 54 carry external signals to and from I/O PCB 26. Cables 54 provide a low-resistance source for conducting common mode energy EMI noise signals to free space, but ferrite attenuator 50 suppresses the common mode energy EMI noise signals close to their source (i.e., system core PCB 22), before the EMI signals reach cables 54.

Similar to the conventional ferrite attenuators installed around cables approximate to where the cables exit the computer system, which are described in the Background of the Invention section of the present specification, ferrite attenuator 50 elevates EMI noise source impedance via electrical losses in ferrite attenuator 50 to suppress the common mode energy EMI noise signals. As a result, common mode energy EMI noise propagation to free space is significantly reduced. Ferrite attenuator 50 more effectively suppresses common mode energy EMI, because ferrite attenuator 50 suppresses common mode energy EMI close to its source (i.e., system core PCB 22). This follows because locating ferrite attenuator 50 closer to the source of the EMI reduces the EMI noise source impedance of the conducting paths up to, but not due to the ferrite attenuator, which causes the EMI noise source impedance due to ferrite attenuator 50 to be a larger percentage of the total EMI noise source impedance up to and including the ferrite attenuator, resulting in a greater percentage suppression of the common mode energy EMI noise. Therefore, ferrite attenuator 50 isolates and suppresses conducted common mode energy EMI noise signals at a point where these EMI noise signals first enter the I/O PCB 26 susceptible domain.

Figure 2:
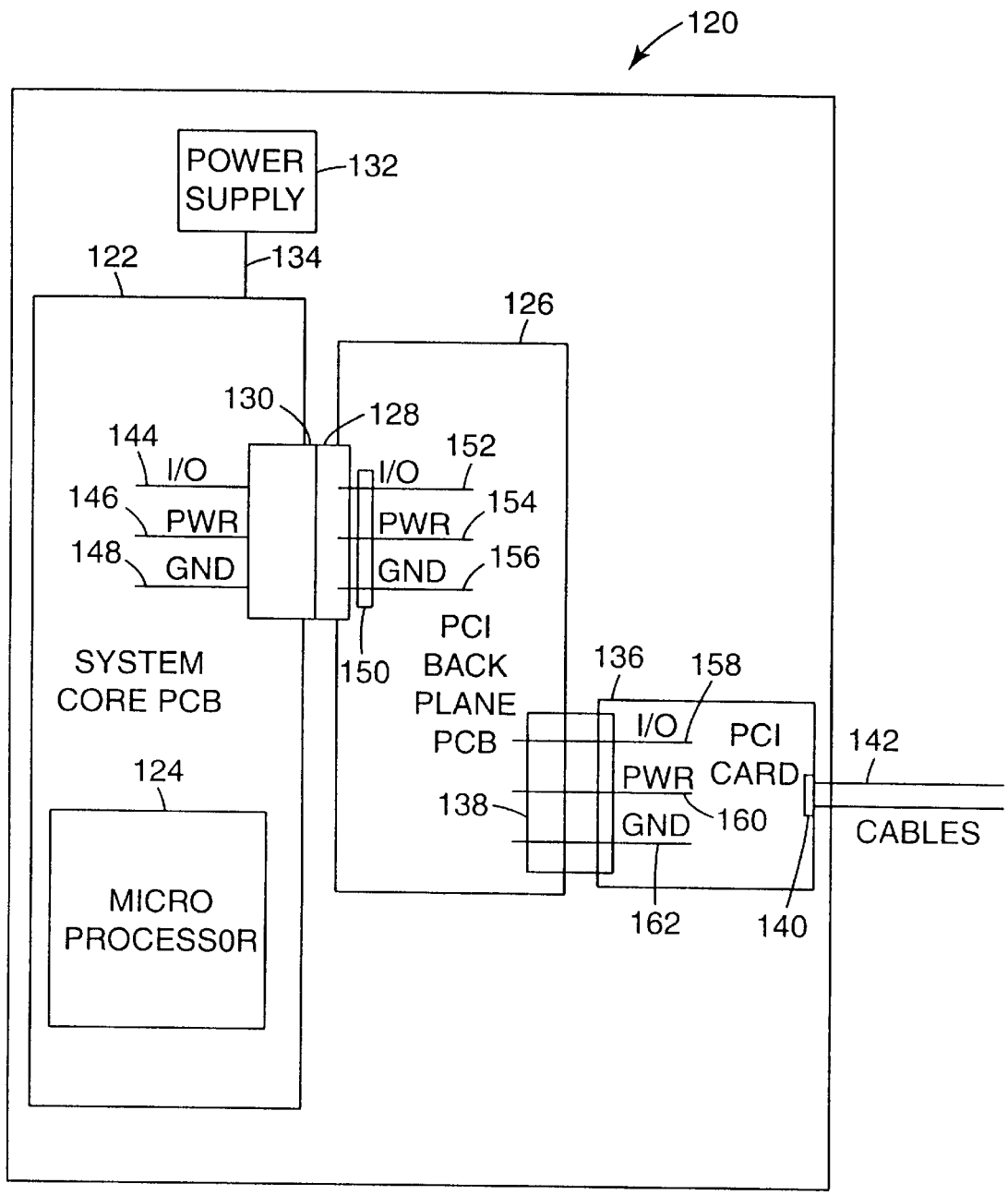
FIG. 2 is a block diagram of a computer system including a PCI back plane PCB having a ferrite attenuator according to the present invention.

Another embodiment of a computer system according to the present invention is illustrated generally at 120 in FIG. 2 in block diagram form. Computer system 120 includes a system core PCB 122 having a microprocessor 124 for performing sequences of logical operations. A peripheral component interconnect (PCI) back plane PCB 126 is coupled to system core PCB 122 via a connector 128 on PCI back plane PCB 126 and a corresponding connector 130 on system core PCB 122. A power supply 132 supplies power to system core PCB 122 via power rails 134.

Computer system 120 also includes a PCI card 136 which is insertable into a PCI slot 138 of PCI back plane PCB 126. PCI card 136 includes cable connectors 140 for coupling cables 142 to PCI card 136. Cables 142 carry external signals to and from PCI card 136.

System core PCB 122 which includes microprocessor 124 constitutes a distinct domain which includes energetic EMI noise sources. Therefore, the system core PCB 122 domain is partitioned from the rest of computer system 120 to block and isolate most of the direct radiated EMI noise signals from entering other susceptible domains. PCI back plane PCB 126 and PCI card 136 constitute two such susceptible domains which themselves are not significant contributors to the total direct radiated EMI noise produced by computer system 120. PCI back plane PCB 126 and PCI card 136 are, however, susceptible to conducting common mode energy EMI noise signals if these EMI noise signals are not properly contained.

System core PCB 122 provides I/O signals to connector 130 on I/O signal paths 144. System core PCB 122 provides power to connector 130 through power paths 146. System core PCB provides a ground level to connector 130 through ground paths 148 The I/O signals conducted on I/O signal paths 144, the power conducted on power paths 146, and the ground level coupled on ground paths 148 are all conducted through connector 130 to connector 128 of PCI back plane PCB 126.

PCI back plane PCB 126 includes I/O signal paths 152 for carrying I/O signals between connector 128 and PCI back plane PCB 126. PCI back plane PCB 126 includes power paths 154 for conducting power to PCI back plane PCB 126 from connector 128. PCI back plane PCB 126 includes ground paths 156 for connecting PCI back plane PCB 126 to a ground level.

PCI card 136 includes I/O signal paths 158 for carrying I/O signals between PCI slot 138 and PCI card 136. PCI card 136 includes power paths 160 for conducting power to PCI card 136 from PCI slot 138. PCI card 136 includes ground paths 162 for connecting PCI card 136 to a ground level.

A ferrite attenuator 150 is installed around PCI back plane PCB 126 at a location as close as possible to connector 128. Ferrite attenuator 150 surrounds I/O signal paths 152, power paths 154, and ground paths 156 so that all signals including power and ground are surrounded by the ferrite material of ferrite attenuator 150 to suppress common mode energy EMI noise signals. Ferrite attenuator 150 is positioned and locked in place relative to PCI back plane PCB 126. No signal, power, or ground paths are permitted through chassis or other electrical interconnections, because alternative signal paths would corrupt the EMI isolation provided by ferrite attenuator 150 by providing a path to conduct common mode energy EMI from system core PCB 122 to PCI back plane PCB 126 to PCI card 136, from which the EMI noise would be radiated to an outside environment.

Cables 142 attached to PCI card 136 provide a low-resistance source for conducting common mode energy EMI noise signals to free space, but ferrite attenuator 150 installed on PCI back plane PCB 126 suppresses the common mode energy EMI noise signals close to their source (i.e., system core PCB 122) before the EMI noise signals read cables 142.

Similar to the conventional ferrite attenuators installed around cables approximate to where the cables exit the computer system, which are described in the Background of the Invention section of the present specification, ferrite attenuator 150 elevates EMI noise source impedance via electrical losses in ferrite attenuator 150 to suppress the common mode energy EMI noise signals. As a result, common mode energy EMI noise propagation to free space is significantly reduced. Ferrite attenuator 150 more effectively suppresses common mode energy EMI because ferrite attenuator 150 suppresses common mode energy EMI close to its source (i.e., system core PCB 22). This follows because locating ferrite attenuator 150 closer to the source of the EMI reduces the EMI noise source impedance of the conducting paths up to, but not due to the ferrite attenuator, which causes the EMI noise source impedance due to ferrite attenuator 50 to be a larger percentage of the total EMI noise source impedance up to and including the ferrite attenuator, resulting in a greater percentage suppression of the common mode energy EMI noise. Therefore, ferrite attenuator 50 isolates and suppresses conducted common mode energy EMI noise signals at a point where these EMI noise signals first enter the I/O PCB 26 susceptible domain.

Figure 3:
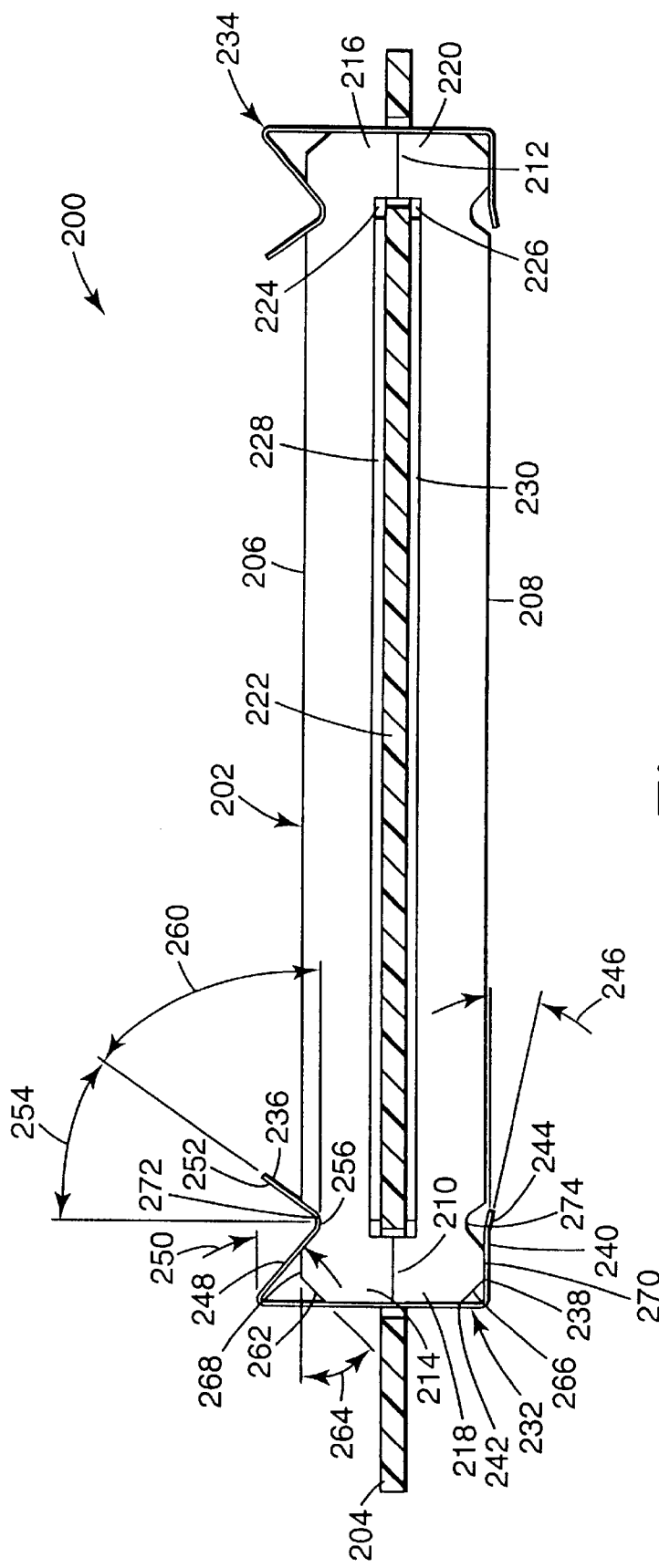
FIG. 3 is a side-view of a PCB assembly having a ferrite attenuator assembly according to the present invention attached thereto.
Figure 4:
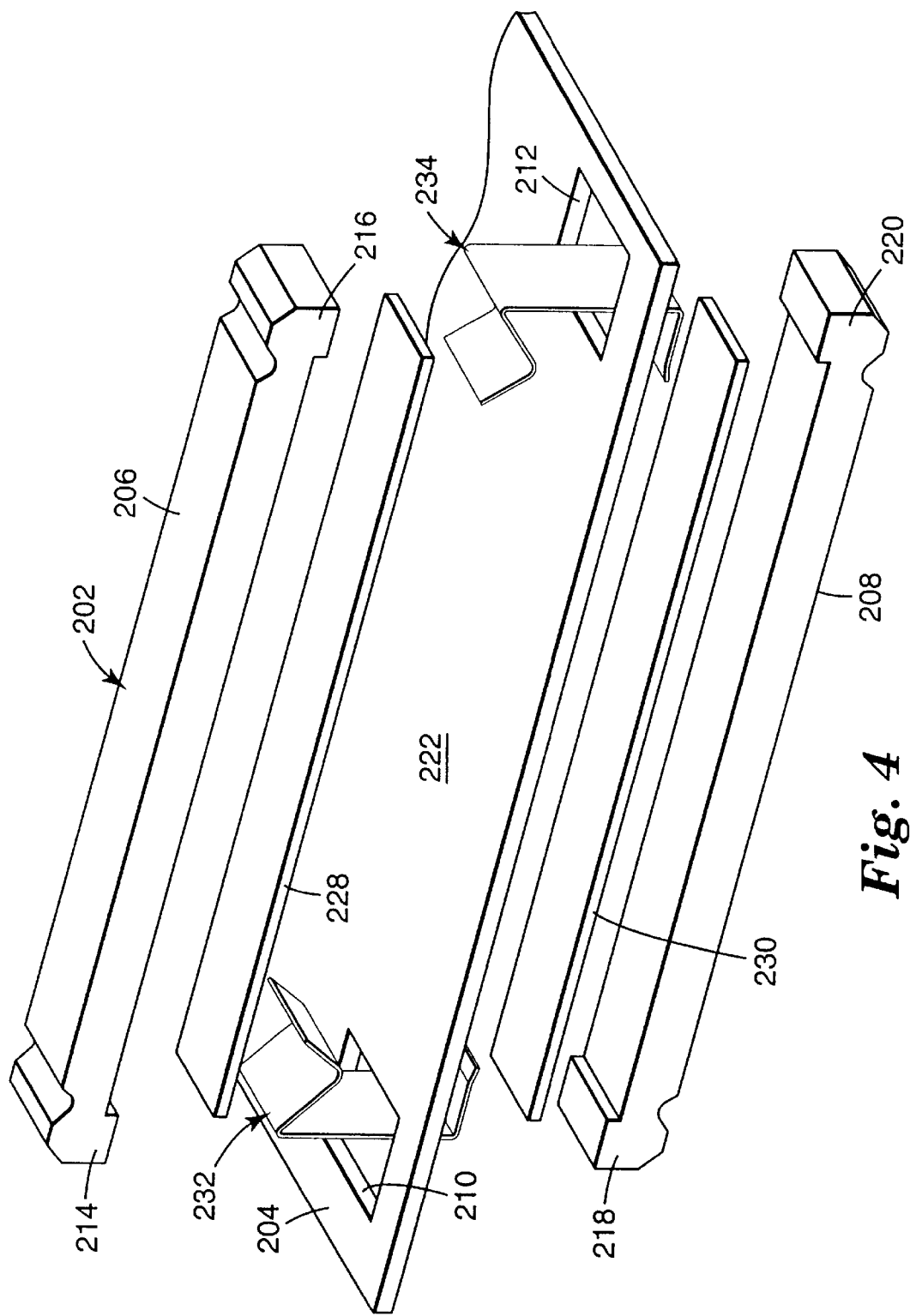
FIG. 4 is a perspective view of the PCB assembly of FIG. 3 with an exploded view of the ferrite attenuator assembly according to the present invention.

FIGS. 3 and 4 both illustrate a PCB assembly 200 having one embodiment of a ferrite attenuator assembly 202 according to the present invention. FIG. 3 is a side-view of PCB assembly 200, while FIG. 4 is a perspective view of PCB assembly 200 where ferrite attenuator assembly 202 is illustrated in an exploded view. PCB assembly 200 includes a PCB 204. Ferrite attenuator assembly 202 includes an upper ferrite attenuator portion 206 and a lower ferrite attenuator portion 208. Ferrite attenuator portions 206 and 208 are each "C" shaped and fit together around a portion of PCB 204 having I/O signal paths, power paths, and ground paths. PCB 204 includes a first cut-out portion 210 and a second cut-out portion 212 formed therein. Cut-out portions 210 and 212 provide openings for disposing ends 214 and 216 of upper ferrite attenuator 25 portion 206 and ends 218 and 220 of lower ferrite attenuator portion 208. End 214 of upper ferrite attenuator portion 206 mates with end 218 of lower ferrite attenuator portion 208 in cut-out portion 210 of PCB 204. End 216 of upper ferrite attenuator portion 206 mates with end 220 of lower ferrite attenuator portion 208 in cut-out portion 212 of PCB 204.

"C" shaped ferrite attenuator portions 206 and 208 together form a ferrite attenuator ring around a signal carrying portion 222 of PCB 204 which includes all I/O signal paths, power paths, and ground paths to and from PCB 204. In this way, all signals including power and ground are surrounded by the ferrite attenuator ring formed by ferrite attenuator portions 206 and 208 to suppress common mode energy EMI noise signals carried on the signal paths.

An upper gap 224 is formed between "C" shaped upper ferrite attenuator portion 206 and a top side of signal carrying PCB portion 222. Similarly, a lower gap 226 is formed between "C" shaped lower ferrite attenuator portion 208 and a bottom side of signaling carrying PCB portion 222. Ferrite attenuator assembly 202 includes an upper foam pad dampener 228 disposed between upper ferrite attenuator portion 206 and the top side of signal carrying PCB portion 222. Ferrite attenuator assembly 202 also includes a lower foam pad dampener 230 disposed between lower ferrite attenuator portion 208 and the bottom side of signal carrying PCB portion 222 of PCB 204. Upper foam pad dampener 228 fills upper gap 224 and lower foam pad dampener 230 fills lower gap 226. Upper foam pad dampener 228 is preferably attached to the inside face of upper ferrite attenuator portion 206 and lower foam pad dampener 230 is preferably attached to the inside face of lower ferrite attenuator portion 208.

Foam pad dampeners 228 and 230 dampen shock exerted on ferrite attenuator portions 206 and 208, which can occur during system handling and system use to protect the ferrite material which forms ferrite attenuator portions 206 and 208 from breaking, as ferrite material is very brittle. In addition, foam pad dampeners 228 and 230 fill up gaps 224 and 226 respectively, to accommodate various thicknesses of PCBs 204. Furthermore, various tolerance stacks from differing height and sized integrated circuit chips and other components attached to PCB 204 at signal carrying portion 222 are accommodated by using foam pad dampeners 228 and 230. In addition, the sensitive integrated circuit chips and other components attached to PCB 204 at signal carrying portion 222 are also protected from shock exerted during system handling and system use.

Ferrite attenuator assembly 202 also includes clips 232 and 234, which are metal clips in one embodiment of the present invention. Metal clip 232 fits over end 214 of upper ferrite attenuator portion 206 and end 218 of lower ferrite attenuator portion 208 to secure the mated ends together. Similarly, metal clip 234 fits over end 216 of upper ferrite attenuator portion 206 and end 220 of lower ferrite attenuator portion 208 to secure the mated ends together. Metal clips 232 and 234 provide force to compress foam pad dampeners 228 and 230 between PCB 204 and the ferrite attenuator portions 206 and 208 to obtain elastic attachment of the ferrite attenuator portions to PCB 204.

The detailed construction and operation of clips 232 and 234 to mate and secure the ends of the ferrite attenuator portions 206 and 208 together are substantially similar, and therefore, only the operation and construction of clip 232 is described in detail herein. Metal clip 232 includes an upper jaw 236, a lower jaw 238, and a back wall 242. Lower jaw 238 includes a flat portion 240 extending inwardly from back wall 242. Lower jaw 238 includes a lead-in portion 244 extending inwardly from flat portion 240 at the end of the lower jaw. Lead-in portion 244 extends downwardly at an angle, indicated by arrows 246, which in one example embodiment is approximately 10 degrees.

Upper jaw 236 includes an angled jaw portion 248 which extends inwardly and downwardly from back-wall 242 at an angle, indicated by arrows 250, which in one example embodiment is approximately 40 degrees. Upper jaw 236 includes a lead-in portion 252 extending inwardly at an upward angle from angled jaw portion 248, as indicated by arrows 254, which indicate an angle formed by lead-in portion 252 and a line perpendicular to PCB 204. In one example embodiment, angle 254 is approximately 35 degrees. An elbow 256 is formed in upper jaw 236 at the junction between angled jaw portion 248 and lead-in portion 252. Lead-in portion 252 has a lead-in angel from elbow 256, indicated by arrows 260. In the example embodiment where the angle indicated by arrows 254 is approximately 35 degrees, lead-in angle 260 is approximately 55 degrees.

In the embodiment of ferrite attenuator assembly 202 illustrated in FIGS. 3 and 4, each of the ends 214, 216, 218, and 220 of ferrite attenuator portions 206 and 208 include the following features, which are described with respect to ends 214 and 218. A ramp 262 is located on end 214 of ferrite attenuator portion 206 and has an angle indicated by arrows 264, which in an example embodiment is approximately 45 degrees. A substantially similar ramp 266 is located on end 218 of ferrite attenuator portion 208. A flat portion 268 extends inwardly from ramp 262, and a flat portion 270 extends inwardly from ramp 266. A grove 272 is located inward from flat portion 268 and a grove 274 is located inward from flat portion 270. As illustrated in FIG. 3, the angles of elbow 256 match the angles of groove 272, such that a first wall of groove 272 extends inwardly and downwardly from flat portion 268 at an angle indicated by arrows 250 (e.g. 40 degrees in one example embodiment), and a second wall of groove 272 extends inwardly and upwardly from the first wall of groove 272 at an angle indicated by arrows 254 (e.g., 35 degrees in an example embodiment), which indicate an angle formed by the second wall of groove 272 and a line perpendicular to PCB 204.

Metal clip 232 easily slides over ferrite attenuator portions 206 and 208, because lead-in portion 252 of the upper jaw of clip 232 slides over ramp 262 of ferrite attenuator portion 206, and lead-in portion 244 of the lower jaw of clip 232 slides over ramp 266 of ferrite attenuator portion 208. Furthermore, elbow 256 of the upper jaw of clip 232 snaps securely into groove 272 of ferrite attenuator portion 206. In addition, flat portion 240 of the lower jaw of clip 232 matches flat portion 270 of ferrite attenuator portion 208. Metal clips 232 and 234 include lead-in portions on their upper and lower jaws to permit easy sliding of the clips over ferrite attenuator portions 206 and 208, so that the ferrite attenuator portions are clamped together without damaging the ferrite material that forms the ferrite attenuator portions, as ferrite material is quite fragile and brittle.

A system, such as computer systems 20 and 120 which incorporate a PCB assembly, such as PCB assembly 200 according to the present invention, suppresses common mode energy EMI noise which propagates through interconnecting electrical paths, power paths, and ground paths between domains as close as possible to the source of the EMI noise by surrounding the input/output signal paths, the power paths, and the ground paths with a ferrite attenuator, such as formed by ferrite attenuator portions 206 and 208. The cost of such a system according to the present invention is low compared to the conventional technique of installing ferrite around each individual cable. With the present invention, one ferrite attenuator surrounds all of the signal paths between an EMI generating domain and an adjacent EMI conducting domain. Other potential downstream EMI conducting domains do not require separate ferrite attenuators, because the EMI noise is suppressed at the domain adjacent the EMI generating domain. Moreover, a larger percentage of common mode energy EMI noise is suppressed with the ferrite attenuator being as close as possible to the source of the EMI noise, because the effective increase in EMI noise source impedance becomes greater as the ferrite attenuator is disposed closer to the EMI source.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A printed circuit board (PCB) assembly comprising:
    a PCB including:
        input/output signal paths for carrying signals to and from the PCB;
        power paths for conducting power to the PCB; and
        ground paths for connecting the PCB to a ground level; and
    a ferrite attenuator surrounding the input/output signal paths, the power paths, and the ground paths.

2. The PCB assembly of claim 1 wherein the ferrite attenuator comprises two ferrite attenuator portions.

3. The PCB assembly of claim 2 wherein the PCB assembly further comprises:
    clips for clamping the two ferrite attenuator portions together.

4. The PCB assembly of claim 2 wherein the clips are metal clips.

5. The PCB assembly of claim 2 wherein the PCB assembly further comprises:
    a first foam pad disposed between a first one of the ferrite attenuator portions and the PCB; and
    a second foam pad disposed between a second one of the ferrite attenuator portions and the PCB.

6. The PCB assembly of claim 2 wherein the two ferrite attenuator portions are each "C" shaped and fit together around a portion of the PCB having the input/output signal paths, the power paths, and the ground paths.

7. The PCB assembly of claim 6 wherein the PCB includes two cut out portions defined therein and the ferrite attenuator portions each include ends which mate together in the PCB cut out portions and the PCB assembly further comprises:
    two clips for clamping the ends of the two ferrite attenuator portions together in the PCB cut out portions.

8. The PCB assembly of claim 7 wherein at least one of the ferrite attenuator portions includes:
    a ramp located at each end of the at least one ferrite attenuator portion; and
    a groove located inwardly from the ramp.

9. The PCB assembly of claim 8 wherein each clip includes at least one lead-in portion for permitting each clip to more easily slide over the ramp of the at least one ferrite attenuator portion.

10. The PCB assembly of claim 8 wherein each ferrite attenuator portion includes a ramp located at each end of the ferrite attenuator portion and each clip includes an upper jaw having a lead-in portion and a lower jaw having a lead-in portion to permit each chip to slide easily over the ramps of the ferrite attenuator portions.

11. The PCB assembly of claim 8 wherein each clip includes an elbow portion which matches the groove of the at least one ferrite attenuator portion.

12. The PCB assembly of claim 8 wherein the at least one ferrite attenuator portion includes a flat portion located between the ramp and the groove.

13. The PCB assembly of claim 12 wherein each clip includes a flat portion which matches the flat portion of the at least one ferrite attenuator portion.

14. The PCB assembly of claim 1 wherein the PCB further comprises:
    cable connectors for coupling cables to the PCB for carrying external signals to and from the PCB.

15. A computer system comprising:
    a first printed circuit board (PCB) including a microprocessor;
    a second PCB electrically coupled to the first PCB and including:
        input/output signal paths for carrying signals between the second PCB and the first PCB board;
        power paths for conducting power to the second PCB; and
        ground paths for connecting the second PCB to a ground level; and
    a ferrite attenuator installed on the second PCB and surrounding the input/output signal paths, the power paths, and the ground paths.

16. The computer system of claim 15 further comprising:
    a third PCB electrically coupled to the second PCB and including:
        cable connectors for coupling cables to the third PCB for carrying external signals to and from the third PCB.

17. The computer system of claim 15 wherein the second PCB further includes:
    cable connectors for coupling cables to the second PCB for carrying external signals to and from the second PCB.

18. A method of suppressing electro-magnetic interference (EMI) from a system having printed circuit board (PCB) comprising input/output signal paths for carrying signals to and from the PCB, power paths for conducting power to the PCB, ground paths for connecting the PCB to a ground level, the method comprising the steps of:
    surrounding the input/output signal paths, the power paths, and the ground paths with a ferrite attenuator.

19. The method of claim 18 wherein the ferrite attenuator includes two ferrite attenuator portions and the method further comprises the step of:
    clamping the two ferrite attenuator portions together.

20. The method of claim 19 further comprising the step of:
    dampening shock exerted on the ferrite attenuator occurring during system handling and system use by disposing a first foam pad between a first one of the ferrite attenuator portions and the PCB and disposing a second foam pad between a second one of the ferrite attenuator portions and the PCB.

* * * * *